United States Patent [19]

Rupp

[11] Patent Number: 4,956,566

[45] Date of Patent: Sep. 11, 1990

[54] CIRCUIT CONFIGURATION WITH A GENERATOR SYSTEM FOR PATH- OR ANGLE-DEPENDENT SIGNALS

[75] Inventor: Juergen Rupp, Erlangen, Fed. Rep. of Germany

[73] Assignee: Siemens Aktiengesellschaft, Berlin & Munich, Fed. Rep. of Germany

[21] Appl. No.: 295,238

[22] Filed: Jan. 9, 1989

[30] Foreign Application Priority Data

Jan. 28, 1988 [DE] Fed. Rep. of Germany ....... 3802549

[51] Int. Cl.$^5$ .......................... H03K 5/00; H03K 5/01
[52] U.S. Cl. .................................. 307/261; 307/268; 307/262; 328/133; 328/181
[58] Field of Search .................. 328/133, 181, 178, 21, 328/28, 34, 30, 23, 25; 307/514, 515, 511, 262, 261, 268, 228

[56] References Cited

U.S. PATENT DOCUMENTS

| | | | |
|---|---|---|---|
| 3,398,372 | 8/1968 | Wu et al. | 328/28 |
| 3,675,238 | 7/1972 | Butscher | 340/347 |
| 3,859,603 | 1/1975 | Herzner | 328/181 |
| 4,176,398 | 11/1979 | Rider | 328/181 |
| 4,422,044 | 12/1983 | Mueller | 328/181 |
| 4,594,450 | 6/1986 | Currie et al. | 318/661 |
| 4,841,251 | 6/1989 | Hartmann et al. | 328/181 |

FOREIGN PATENT DOCUMENTS 3126047 6/1982 Fed. Rep. of Germany .
3218101 7/1986 Fed. Rep. of Germany .
2234550 1/1975 France .

OTHER PUBLICATIONS

NTIS Technical Notes (1984), Nov., No. 11, Part B. NTMB4–0999, J. R. Currie et al., NASA Tech Brief, "Circuitry for Angle Measurements".

Primary Examiner—Stanley D. Miller
Assistant Examiner—Richard Roseen
Attorney, Agent, or Firm—Kenyon & Kenyon

[57] ABSTRACT

From two path- or angle-dependent signals (A, B) of identical amplitude and period generated by an incremental generator (GS) which signals have a phase shift of 90~ el. to each other a sequence signal $|A|/(|A|+|B|)$ dependent linearly on the path or angle is formed in that the generator signals (A, B) are rectified and a signal is formed in a converter (U1) corresponding to the quotient of the magnitude ($|A|$) of one of the two generator signals (A) to the sum of the magnitudes ($|A|+|B|$) of both generator signals (A, B). From the sequence signal the position within a particular quarter period is determined. Which quarter period this is in each instance is determined by an investigation of the position of the generator signals (A, B) with respect to each other.

4 Claims, 1 Drawing Sheet

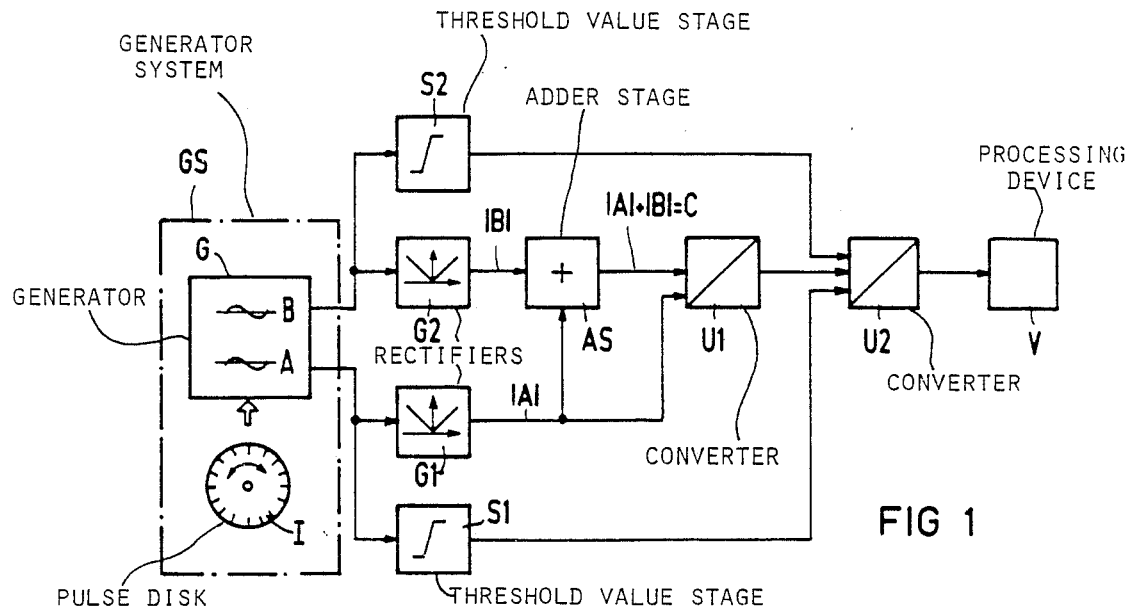
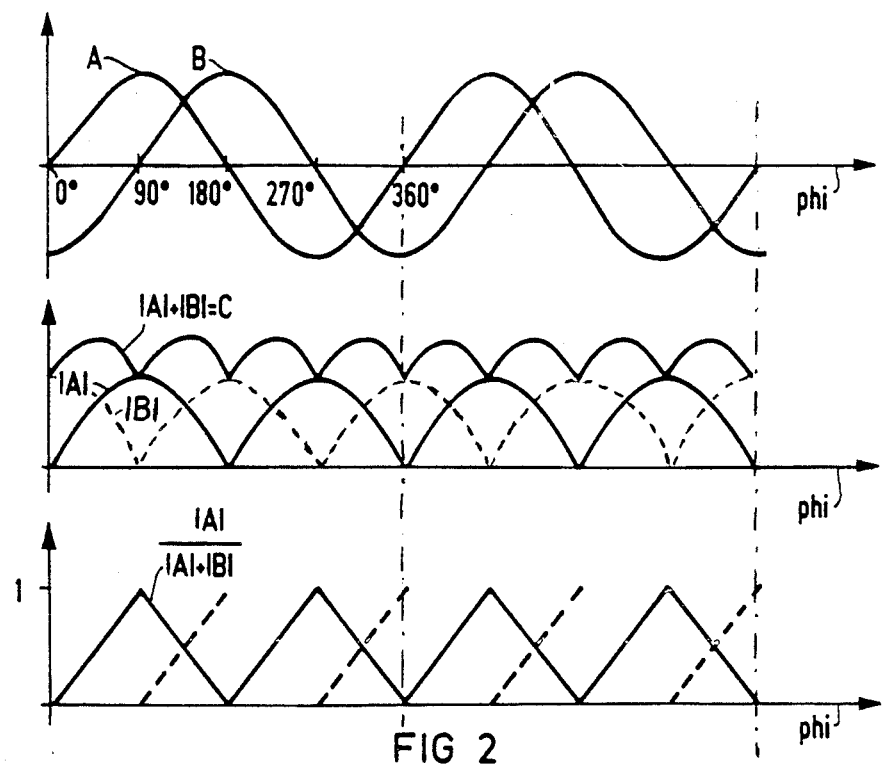

CIRCUIT CONFIGURATION WITH A GENERATOR SYSTEM FOR PATH- OR ANGLE-DEPENDENT SIGNALS

BACKGROUND OF THE INVENTION

The present invention relates to a circuit configuration with a generator system which supplies two path- or angle-dependent sinusoidal signals shifted in phase by 90° of identical amplitude and period, with a digitizable sequence signal dependent linearly on path or angle, being formed of these two signals by way of a rectification.

In particular for the detection of motions of rotation of machine parts, digital incremental generators with approximately sinusoidal output signals which have a 90° phase shift are customary. When these generator signals are to be evaluated, signal processing required therefore can be facilitated in that a linear connection between path or angle and a sequence signal derived from the generator signal is achieved. A circuit configuration hereto is known from DE-PS-No. 32 18 101. In this circuit, from the generator signals through rectification and minimum value formation, an approximately triangular signal is generated whose amplitude has a linear connection to the position within one eighth cycle of the generator. Through analog to digital conversion and linkage with comparator signals which select the correct eighth cycle, the subdivision of the generator period is achieved.

SUMMARY OF THE INVENTION

An object of the present invention is to provide a circuit configuration of the initially stated type in which, with low technical complexity, a linear connection between path or angle and a sequence gained from the generator signals exists.

The above and other objects of the invention are achieved by a circuit configuration adapted to be coupled to a generator system which supplies two path- or angle-dependent sinusoidal signals shifted with respect to phase by 90° el. of the same amplitude and period, with a digitizable sequence signal linearly dependent on path or angle being formed from these two signals via a rectification, comprising a converter for forming an output signal corresponding to the quotient of the magnitude of one of the signals to the sum of the magnitudes of both signals, said output signal being suppliable as a sequence signal to further evaluating devices.

According to the invention, the object is solved in that in a converter an output signal is formed corresponding to the quotient of the magnitude of a signal to the sum of the magnitudes of both signals which as sequence signal is suppliable to additional evaluation units. In this connection it is particularly advantageous that no reference regulation is necessary, that for the conversion processes commercially available modules, for example IR3K06 (SHARP) or TS 8308 (Thomson) can be used, that the path or angle measurement is possible with a high degree of precision, that generator signal errors, be they errors with respect to amplitude identity, phase or offset errors, influence only insignificantly the measuring result and that for the overall device no particular adjustment is required.

A first advantageous implementation of the invention is characterized in that remaining non-linearities of the resulting triangular sequence signal are reducible through a signal conversion corresponding to a characteristic adapted to the non-linearity. In the process the system measuring error, already very small, can be again reduced according to the requirements.

A further implementation of the invention is characterized in that an evaluation circuit is provided through which corresponding to the polarity of the signals of the generator system the in each instance relevant quarter cycle can be determined. Hereby a unique position determination within one period is ensured.

Through the fact that the resulting triangular sequence signal, through mirroring of the particular ascending or descending signal train, is transformable into a sawtooth sequence signal, a particularly simple further signal evaluation results since the signals in the particular quarter cycles are of identical form.

BRIEF DESCRIPTION OF THE DRAWINGS

The invention will be described in greater detail in the following detailed description with reference to the drawings, in which:

FIG. 1 is a block circuit diagram; and
FIG. 2 shows a few significant signal progressions.

DETAILED DESCRIPTION

In the representation according to FIG. 1 generator system GS for receiving motions of rotation is shown in which a pulse disk I is moved mechanically corresponding to the rotation motion to be detected and where a generator G supplies, via two sensing heads not shown for reasons of clarity, two sinusoidal angle-dependent signals shifted in phase by 90° el. with respect to each other of identical amplitude and period corresponding to the sequence of the pulse marks of the pulse disk I. The signals of the generator G may be denoted by A and B.

Signal A is rectified with the aid of rectifier G1 at whose output consequently a signal $|A|$ corresponding to the magnitude of signal A is present. Signal B is supplied to rectifier G2 which likewise transforms signal B into an output signal $|B|$ corresponding to the magnitude of signal B. Signals $|A|$ and $|B|$ are supplied to an adder stage AS which forms an output signal corresponding to the sum $|A|+|B|$ of magnitudes $|A|$ and $|B|$ of signals A and B, which output signal will be referred to as signal C below. This signal C reaches the first input of a converter U1 to which as second signal the signal $|A|$ is supplied. In converter U1 the quotient of the signal $|A|$ and signal $|A|+|B|$ is formed. A signal corresponding to this quotient proves to be a sequence signal nearly linearly dependent on the angular position of the pulse disk I.

The signals A and B of generator G, depending on the motion of rotation of the pulse disk I, are represented in the upper diagram of FIG. 2. Assuming a clockwise direction of rotation, signal B which has an amplitude and a period identical to signal A follows it with a delay of 90° el. In the upper diagram, in addition, the limits of the significant quarter periods, i.e. the values of angle phi of 0°, 90°, 180°, 270°, and 360° are indicated.

In the center diagram of FIG. 2 on the same scale as in the upper diagram the magnitude of signal A, i.e. signal $|A|$ as well as the sum signal of magnitudes of signal A and of signal B, thus signal $C=|A|+|B|$ are shown.

In the lower diagram of FIG. 2 it is shown that the quotient from signal $|A|$ and signal $|A|+|B|$ leads to a triangular progression which is indicated by a solid line. Such a signal is generated in converter U1 according to FIG. 1, with this signal being digitizable in converter U1. Between angle phi to be determined of the pulse disk I and the signal $|A|/(|A|+|B|)$ determined by converter U1 a linear relationship obtains. So that in as simple a manner as possible to each amplitude of this sequence signal an angle value can be assigned which indicates each position within each quarter period, in converter U1 in each instance each descending signal train of the triangularly shaped sequence signal is reflected as is indicated in the lower representation according to FIG. 2 through dashed lines. Each amplitude of signal $|A|/(|A|+|B|)$ hence has uniquely assigned to it an angle value within a quarter period. Reflection can also take place advantageously in a succeeding converter U2 in which the particular quarter period is known so that then, for example, during each second and fourth quarter period reflection can be carried out. Additional functions of converter U2 will be discussed below.

So that not only the position within a quarter period can be determined but so that the position within each full period is detectable, signals A and B are supplied, as shown in FIG. 1 to threshold value stages S1 and S2, which subsequently when signal A or signal B have positive polarity send a code signal to converter U? to which also the output signal of converter U1 is supplied. If only signal A has positive polarity, the system is in the first quarter period, if the first signal A as well as also the second signal B each have positive polarity, the second quarter period is present, if only signal B has positive polarity the third quarter period is present. and if neither of signals A and B has positive polarity, the fourth quarter period is present. Accordingly, the angle values determined by converter U1 can be increased additively for the position within the particular quarter period in converter U2 by 0°, 90°, 180° or 270° and a corresponding output signal is conducted further from converter U2 to succeeding processing devices V. In the representation according to FIG. 2 the sequence signals in the lower diagram are depicted as an ideal delta or sawtooth function. Strictly speaking, however, a slight non-linearity is present which at 22.5° or 67.5° generates an error of $+/-3.86°$. This error is negligible for many cases; however, it is also relatively simple to carry out extensive compensation through a transfer characteristic. The following dimensioning has proven favorable.

The quotient $|A|/(|A|+|B|)$ may be called Q and may represent the triangular signal laden with error $+/-3.86°$. This could then, according to the suggested characteristic, be corrected in the following manner to form signal X. At phi greater than 0° and smaller than 22.5°, $X=0.862 * Q$. At phi greater than 22.5° and smaller than 67.5°, $X=1.19 * Q-0.095$; and at phi greater than 67.5° and smaller than 90°, $X=0.862 * Q+0.138$. With such a correction the maximum error is only 1.6° and can be neglected relative to the phase errors of generator G. The course of X over angles in the other quarter period from 90° to 360° is analogous to the range between 0° and 90° and thus does not need to be set out.

As far as generator signal errors occur, i.e. errors of amplitude identity, phase and offset errors, measuring errors do occur compared to the ideal case, but a significant advantage is obtained in that the output code in each case remains complete, i.e. the course of X always reaches from 0 to 1 and the curves remain monotonic. As a consequence of the generator error only a linear distortion can be noticed which given the quality of commercially available generators remains within narrow tolerances.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A circuit arrangement adapted to be coupled to a generator system supplying two path- or angle-dependent sinusoidal signals shifted with respect to phase by 90° ed, comprising first and second rectifiers, the first signal being supplied to the first rectifier and the second signal being supplied to the second rectifier, a summation circuit, output signals of the first and second rectifiers being coupled to inputs of the summation circuit, and a converter receiving an output signal of the summation circuit and an output signal of the second rectifier, said converter providing an output signal corresponding to a quotient of the output signal of the second rectifier circuit and the output signal of the summation circuit, said output signal of the converter having a magnitude substantially proportional to the respective path or angle during a quarter period of the sinusoidal signals.

2. The circuit arrangement recited in claim 1, further comprising means for reducing a remaining non-linearity of the output signal of the converter through a signal conversion in accordance with a characteristic adapted to the remaining non-linearity.

3. The circuit arrangement recited in claim 1, further comprising an evaluation circuit for determining the relevant quarter period according to the polarity of the first and second signals of the generator system, said evaluation circuit being coupled to an output of said converter.

4. The circuit arrangement recited in claim 1, wherein the output signal from the converter comprises a triangular signal, and further comprising means for transforming the triangular signal through reflection of ascending or descending edges of the triangular signal into a sawtooth-shaped signal.

* * * * *